United States Patent [19]

Foster et al.

[11] 4,297,150
[45] Oct. 27, 1981

[54] PROTECTIVE METAL OXIDE FILMS ON METAL OR ALLOY SUBSTRATE SURFACES SUSCEPTIBLE TO COKING, CORROSION OR CATALYTIC ACTIVITY

[75] Inventors: Alan I. Foster, Ashford; Malcolm L. Sims, Hersham; Dennis Young, Staines, all of England

[73] Assignee: The British Petroleum Company Limited, London, England

[21] Appl. No.: 163,866

[22] Filed: Jun. 27, 1980

[30] Foreign Application Priority Data

Jul. 7, 1979 [GB] United Kingdom ............... 23787/79

[51] Int. Cl.$^3$ ............................................... C23C 7/02
[52] U.S. Cl. .................... 148/6.3; 148/6.31; 148/6.35; 427/255; 427/255.1; 427/255.3; 427/419.3
[58] Field of Search ............... 427/255.3, 255.1, 419.3, 427/80; 204/38 A; 148/6.3, 6.35, 6.31

[56] References Cited

U.S. PATENT DOCUMENTS 3,730,766  5/1973  Nishimatsu et al. ............. 427/419.3
4,111,763  9/1978  Pryor ................................. 204/38 A

FOREIGN PATENT DOCUMENTS 49-69552  7/1974  Japan .
1275339   5/1972  United Kingdom .
1306784   2/1973  United Kingdom .
2004851A  4/1979  United Kingdom .
1555884  11/1979  United Kingdom .

Primary Examiner—Ralph S. Kendall
Attorney, Agent, or Firm—Brooks, Haidt, Haffner & Delahunty

[57] ABSTRACT

This case relates to a process for forming protective metal oxide films on metal or alloy substrate surfaces susceptible to coking, corrosion or catalytic activity. The process comprises first preoxidizing the substrate surface and then depositing on the pre-oxidized surface a metal oxide of Ca, Mg, Al, Ga, Ti, Zr, Hf, Ta, Nb or Cr by vapor phase decomposition of a volatile compound of the metal which has at least one metal-oxygen bond. Nitrogen, helium, argon, carbon dioxide, air or steam may be used as carrier gases for the metal compound.

14 Claims, No Drawings

PROTECTIVE METAL OXIDE FILMS ON METAL OR ALLOY SUBSTRATE SURFACES SUSCEPTIBLE TO COKING, CORROSION OR CATALYTIC ACTIVITY

The present invention relates to a process for forming protective films on metal or alloy surfaces.

Structures made from metals or alloys are frequently used in high temperature reaction system; in aqueous environments; as reactors in the production of chemicals such as acrylonitrile, phthalic anhydride, vinyl chloride monomer and vinyl acetate; as containers for gaseous components under pressure; as heat exchanger surfaces in e.g. advanced gas cooled reactors; and in gas turbine components. Inevitably, the metal or alloy surfaces exposed to high temperature e.g. in thermal cracking processes such as in steam crackers, refinery crackers e.g. visbreakers, and in distillation units for petroleum feedstock, are accompanied by coke formation and carburisation resulting in a restricted flow of the reaction material and reduced heat transfer from the metal or alloy surface to the process gases. Structures made from such substrates when used in aqueous environments are corroded, particularly in heat exchangers. If such substrates are used to build chemical reactors, the chemical reactants and products are liable to be catalysed to form undesirable secondary products, e.g. by over-oxidation due to surface catalytic activity of the reactor walls. In addition, when these metals and alloys are used to contain gases under pressure some gases diffuse through the metal or alloy, e.g. hydrogen or tritium diffuses through steel, nickel or titanium alloys, or cause embrittlement of the metal or alloy. Furthermore, substrates used to produce gas turbine components are exposed to corrosive environments. Moreover metals and alloys conventionally used for producing supports for monolithic catalysts suffer from problems such as lack of adhesion of the catalyst and catalyst support thereon and robustness of the support.

Conventional methods used to reduce coke formation and carburisation in steam-cracking coils involve steam pre-treatment of the surface to promote formation of a protective oxide skin. Steam dilution of the hydrocarbon vapours has also been used to reduce the level of homogeneous coking. Also, sulphur compounds are added to the process gases to poison active nickel sites and so inhibit coke formation. However, the coke formation rate (CFR) is still rapid under high severity conditions, and run lengths of about 30 days have been accepted as the norm.

It has also been suggested in Japanese Patent Publication No. 4969552 (Furukawa Electric Co) that coatings resistant to aqueous corrosion may be formed by pyrolytic decomposition of tetraisopropyl titanate vapour mixed with a carrier gas in contact with a metallic base material to form a coat of titanium dioxide on the material. When this technique was repeated with commercially available titanium compound and carrier gases, it was found that the coating process was inefficient and the deposition was irregular, and the resulting coating lacked adequate adhesion and durability in service.

It is therefore an object of the present invention to subject such surfaces to a protective treatment which not only forms adherent and durable coatings but also increases the corrosion and carburisation resistance and reduces adverse catalytic tendency of the surface thereby increasing on-stream run lengths, life expectancy and product yield.

It has now been found that improved protective surface films which are adherent and smooth may be formed on the substrate surface by first preoxidising the surface and subsequently depositing a metal oxide layer thereon by thermal decomposition of a volatile metal compound.

Accordingly the present invention is a process for forming protective films on a metal or alloy substrate surface which process comprises first pre-oxidising the surface at an elevated temperature and then depositing on the pre-oxidised substrate surface a film of a high temperature stable, non-volatile oxide of a metal selected from calcium, magnesium, aluminum, gallium, titanium, zirconium, hafnium, tantalum, niobium and chromium by thermal decomposition from the vapour phase of a volatile compound of the metal having at least one metal-oxygen bond in admixture with an inert or an oxygenated carrier gas in contact with the pre-oxidised surface.

The process of the present invention is suitable for protecting surfaces of metals or alloys comprising one or more of copper, aluminium, titanium, zirconium, tantalum, chromium, cobalt, nickel and iron. Specific examples of alloys which may be subjected to protective treatment according to the process of the present invention include brasses, cupronickels, mild steel, carbon steels, low alloy steels, e.g type 335, "stainless" steels such as types 321, 304 and 316 alloys, high alloy steels such as Incoloys (Registered Trade Mark) and AISI 310/HK 40 grade materials, super alloys such as Inconels (Registered Trade Mark), Nimonics (Registered Trade Mark) and Zircaloys (Registered Trade Mark). These are the alloys most commonly used in the construction of reactors and structures employed in the areas outlined above.

In order to obtain adherent and uniform oxide films it is necessary to preoxidise the substrate surface prior to thermal decomposition of the volatile metal compound in contact therewith. In general the preoxidation of the surface may be achieved by one of the range of oxidation treatments, such as flaming or heating in an oxidising atmosphere such as air, $CO_2$ or steam to provide thin, adherent oxide films, or combinations of such oxidation treatments.

Of the metals which form the protective high temperature stable, non-volatile oxide films covered by this invention, Al, Ti, Zr, Nb, Ta and Cr are preferred.

The metal compounds having at least one metal oxygen bond which are thermally decomposed to the metal oxides are suitably selected from metal alkoxides, metal-α-diketonates and metal carboxylates. Specific examples of the volatile compounds are the ethoxides, normal propoxides, the isopropoxides, the normal and tertiary-butoxides and the acetylacetonates.

The volatile metal compound is vapourised into a carrier gas stream which may be either for instance gases which are inert under the reaction conditions or oxygenated gases. Thus the carrier gas may be selected from one or more of nitrogen, helium argon, carbon dioxide, air and steam. The fact that readily available oxygenated gases can be used as carriers adds to the greater flexibility of the process. In some cases steam cannot be used as a carrier gas and in these cases it is preferable that the carrier gas is substantially dry, i.e. free from moisture. If necessary the volatile compounds may be dissolved in a compatible solvent or diluted with a compatible diluent to reduce viscosity. Examples of such solvents or diluents are toluene, methanol, isopropanol and tertiary butanol; toluene and isopropanol are preferred due to the ease with which they may be dried.

It has been found that with certain co-ordinatively unsaturated metal compounds thermal decomposition under substantially anhydrous conditions gives optimum results. Examples of such compounds are aluminum isopropoxide, titanium isopropoxide, titanium-n-butoxide, zirconium-n-propoxide, aluminium acetylacetonate, chromium acetylacetonate, tantalum ethoxide and niobium ethoxide.

By the expression "under substantially anhydrous conditions" is meant that the system has no more than 10 ppm of moisture. The presence of moisture at levels above 10 ppm may be detrimental to such systems because at the process temperature some of the latently co-ordinatively unsaturated compounds of the relevant metals act as a Lewis acid. These compounds are therefore susceptible to attack by Lewis bases of which water is a prime example. In the system, water or moisture may be present at several points such as the injection point, preheaters, deposition zone, in the starting materials, etc. Thus to bring the moisture content to below the desired level of 10 ppm, it is not only necessary for the reactor system to be flushed with an inert dry gas, preferably the carrier gas, but also to ensure that these gases in themselves are thoroughly dry. This is important because the preliminary pre-oxidation step may have been carried out in the presence of steam. It is also known that commercial grades of gases such as argon, nitrogen, hydrogen, carbon-dioxide, etc can contain a higher level of moisture than that specified above. Thus, prior to thermal decomposition of some of the co-ordinatively unsaturated metal compounds the system must be rendered substantially anhydrous if loss of deposition efficiency, irregular deposition rates, and uneven and rough deposits are to be prevented.

The amount of the volatile metal compound required for the formation of the protective metal oxide will depend upon the nature of the substrate and the thickness of the film required. The concentration of the volatile metal compound in the carrier gas is suitably less than 10.0% v/v, preferably between 0.01 and 1.5% v/v.

The temperature at which the deposition is carried out may be between 20° and 1200° C., but the optimum temperature employed will depend upon the nature of the coating desired. By suitable choice of metal compounds the process can be operated at relatively low temperatures such as 200°–450° C. where the particular application requires low temperature deposition or the substrate will not withstand high temperatures, or at intermediate temperatures, e.g. 600°–800° C. in appropriate cases. The deposition may be carried out at atmospheric pressure, or at increased or reduced pressures.

In some cases it may be advantageous to deposit on a substrate surface by the process of the present invention an oxide layer of the same metal as the substrate. Suitable examples of this type of combination include titanium oxide on titanium, zirconium oxide on zirconium and aluminum oxide on aluminium. In this context the process of the present invention is free from the limitations of known processes which either use thermal treatment in an oxidising atmosphere or anodic deposition. Of these known processes the former has kinetic limitations affecting coating thickness whilst the latter may not be suitable for certain geometric shapes, e.g. the inside of a tube.

The invention is further illustrated with reference to the following Examples.

EXAMPLES 1–9

Surfaces of tubes (each of 6.5 mm ID) of the alloy substrates mild steel, stainless steel 321 and brass (BS 885) were pre-oxidised for 1 hour in the presence of steam or air at a specified temperature as shown in the Table I below. The reactor was thereafter flushed with dry nitrogen to remove any traces of moisture in the system. Each of the preoxidised substrate surfaces having a hot zone of 22 cm were coated with a film of an oxide of titanium by thermally decomposing titanium-n-butoxide vapour diluted with isopropanol (75% alkoxide to 25% diluent v/v) in a carrier gas (0.1% s/s of titanium-n-butoxide vapour) and under the conditions shown in the Table I below. The reactants and carrier gases were pre-dried over activated 4A molecular sieve to bring the moisture content thereof to below 10 ppm. The carrier gas flow rate in each case was adjusted to achieve a residence time of about 0.05 seconds in the hot zone at the decomposition temperature. The thickness of the protective metal oxide film achieved in each case is shown in Table I below. The thicknesses were measured using a Scanning Electron Microscope (SEM) fitted with an Energy Dispersive X-ray Analysis (EDAX) attachment for elemental determination. A calibration graph for the EDAX was prepared using a few samples that were measured both by EDAX and by SEM of the coating cross-section.

TABLE I

| Example No | Substrate | Preoxidation Conditions: oxidant/temp °C. | Carrier gas | Substrate Temp °C. | Duration of Deposition h | Coating thickness μm | Appearance of protective coating |
|---|---|---|---|---|---|---|---|
| 1 | Mild Steel | Steam/500 | $N_2$ | 500 | 3 | 11 | Matt grey black |
| 2 | Mild Steel | Steam/300 | $N_2$ | 300 | 3 | 3.3 | Matt grey black |
| 3 | Mild Steel | Steam/500 | $N_2$ | 200 | 3 | 0.5 | Matt grey |
| 4 | Stainless Steel 321 | Steam/500 | $N_2$ | 200 | 3 | 0.3 | Matt grey |
| 5 | Stainless Steel 321 | Steam/400 | 20% Air + 80% $N_2$ | 400 | 3 | >3 | Matt dark grey |
| 6 | Mild Steel | Steam/300 | $CO_2$ | 300 | 2 | 2.8 | Matt dark grey |
| 7 | Stainless Steel 321 | Air/350 | Air | 350 | 1 | 5.5 | Matt dark purple |
| 8 | Brass | Air/450 | $N_2$ | 450 | 2 | >3 | Grey glass |
| 9 | Brass | Air/300 | $N_2$ | 300 | 2 | 0.3 | Transparent glass |

EXAMPLES 10-33

The surfaces or tubes (each of 6.5 mm ID) of stainless steel 321 were preoxidised in the presence of steam at 700° C. for 1 hour. Each of the preoxidised substrate surfaces (having a hot zone of between 15 and 20 cm) were then coated with a film of a metal oxide by thermally decomposing the corresponding volatile metal compound from its vapour phase using steam or nitrogen as carrier gas under the conditions shown in Table II. The carrier gas flow rate in each case was adjusted to achieve a residence time of about 0.05 seconds in the hot zone at the decomposition temperature. The thickness of the protective mixed oxide film achieved in each case is shown in Table II below. The thicknesses were determined using SEM/EDAX in conjunction with the calibration graph prepared for Examples 1-9. Where an oxide other than that of titanium was employed, the thickness value was corrected by multiplying it by the ratio of the oxide densities. The volatile metal compounds used were either liquids or solids at ambient temperature. Solutions of the solid volatile metal compounds were in some cases prepared by heating the compound in a solvent to promote solution. On cooling such heated solutions, a saturated solution of the volatile metal compound was obtained at ambient temperature. Where the volatile metal compound was a liquid at ambient temperature, a diluent was used in some cases. The solution or diluted liquid was then vapourised and mixed with a carrier gas prior to thermal decomposition. The various solutions referred to in table II had the following approximate concentration of the respective volatile compounds.

| Volatile Metal Compound | Diluent/ Solvent | Concentration In Solvent (% v/v) | Concentration In Gas (% v/v) |
|---|---|---|---|
| Titanium n-butoxide | Toluene | 75 | 0.10 |
| Titanium n-butoxide | Iso-propanol | 75 | 0.01 |
| Aluminum isopropoxide | Toluene | 25 | 0.09 |
| Aluminum acetylacetonate | Toluene | ≈5-10* | ≈0.02-0.05 |
| Chromium acetylacetonate | Toluene | ≈5-10* | ≈0.01-0.03 |
| Zirconium n-propoxide | Toluene | 75 | 0.08 |
| Titanium isopropoxide | None | 100 | 0.08 |

*Saturated Solution at ambient temperature.

TABLE II

| Example No | Volatile Metal Compound | Diluent | Carrier Gas | Substrate Temp °C./Duration h | Coating Thickness μm |
|---|---|---|---|---|---|
| 10 | Titanium-n-butoxide | Isopropanol | $N_2$ | 350/2 | 1.1 |
| 11 | Aluminium isopropoxide | Toluene | $N_2$ | 600/2 | 0.2 |
| 12 | Aluminium isopropoxide | Toluene | $N_2$ | 500/2 | 2.4 |
| 13 | Aluminium isopropoxide | Toluene | $N_2$ | 400/2 | >3 |
| 14 | Aluminium isopropoxide | Toluene | $N_2$ | 300/2 | 1.7 |
| 15 | Aluminium isopropoxide | Toluene | $N_2$ | 250/2 | 0.05 |
| 16 | Chromium acetylacetonate | Toluene | $N_2$ | 700/2 | 2.0 |
| 17 | Chromium acetylacetonate | Toluene | $N_2$ | 600/2 | 0.2 |
| 18 | Chromium acetylacetonate | Toluene | $N_2$ | 750/2 | >2 |
| 19 | Chromium acetylacetonate | Toluene | Steam | 700/2 | >2 |
| 20 | Chromium acetylacetonate | Toluene | Steam | 600/2 | >2 |
| 21 | Aluminium acetylacetonate | Toluene | $N_2$ | 700/2 | >3 |
| 22 | Aluminium acetylacetonate | Toluene | $N_2$ | 600/2 | >3 |
| 23 | Aluminium acetylacetonate | Toluene | $N_2$ | 500/2 | 1.8 |
| 24 | Aluminium acetylacetonate | Toluene | $N_2$ | 400/2 | 0.2 |
| 25 | Aluminium acetylacetonate | Toluene | $N_2$ | 350/2 | 0.1 |
| 26 | Aluminium acetylacetonate | Toluene | $N_2$ | 300/2 | 0.1 |
| 27 | Titanium-n-butoxide | Toluene | $N_2$ | 350/2 | >3 |
| 28 | Titanium-n-butoxide | Toluene | $N_2$ | 300/2 | 1.0 |
| 29 | Titanium isopropoxide* | None | $N_2$ | 400/2 | >3 |
| 30 | Titanium isopropoxide | None | $N_2$ | 350/2 | 3.0 |
| 31 | Zirconium-n-propoxide | Toluene | $N_2$ | 600/2 | 0.2 |
| 32 | Zirconium-n-propoxide | Toluene | $N_2$ | 400/2 | 1.2 |
| 33 | Zirconium-n-propoxide | Toluene | $N_2$ | 300/2 | 0.2 |

*No diluent was used in Examples 29 and 30 and the metal compound was directly volatilised into the carrier gas.

EXAMPLES 34-36

The surfaces of tubes (each 6.5 mm ID) of mold steel were preoxidised in the presence of steam at 400° C. for 3 hours. Each of the preoxidised substrate surfaces (having a hot zone of between 15 and 20 cm) were then coated with a film of a metal oxide by thermally decomposing the corresponding volatile metal compound from its vapour phase using nitrogen as carrier gas under the conditions shown in Table III. The carrier gas flow rate in each case was adjusted to achieve a residence time of about 0.05 seconds in the hot zone at the decomposition temperature. The thickness of the protective mixed oxide film achieved in each case is shown in Table III below. The thicknesses were determined using SEM/EDAX in conjunction with the calibration graph prepared for Examples 1-9 corrected as in Examples 14-33. Although the volatile metal compounds were liquids at ambient temperature, a diluent was used in some cases. The solution or diluted liquid was then vapourised and mixed with the carrier gas prior to thermal decomposition. The various solutions referred to in Table III had the following approximate concentration of the respective volatile compounds.

| Volatile Metal Compound | Diluent/Solvent | Concentration In Solvent (% v/v) | Concentration In Gas (% v/v) |
|---|---|---|---|
| Tantalum ethoxide | None | 100 | 0.06* |
| Tantalum ethoxide | None | 100 | 0.03** |
| Niobium ethoxide | Toluene | 50 | 0.04 |

*Used in Example 34 below
**Used in Example 35 below.

EXAMPLES 34-36

TABLE III

| Example No. | Volatile Metal Compound | Substrate | Substrate Temp (°C.) /Duration (h) | Coating Thickness μM |
|---|---|---|---|---|
| 34 | Tantalum ethoxide | Mild Steel | 400/2 | >1.25 |
| 35 | Tantalum ethoxide | Mild Steel | 350/2 | >1.25 |
| 36 | Niobium ethoxide | Mild Steel | 450/2 | >2.3 |

We claim:

1. A process for forming protective films on a structural metal or alloy substrate surface which comprises first pre-oxidising the surface at an elevated temperature in an oxidixing atmosphere and then depositing on the preoxidised substrate surface a film of a high temperature stable, non-volatile oxide of a metal selected from calcium, magnesium, aluminium, gallium, titanium, zirconium, hafnium, tantalum, niobium and chromium by thermal decomposition from the vapour phase of a volatile compound of the metal having at least one metal-oxygen bond in admixture with an inert or oxygenated carrier gas in contact with the pre-oxidised surface.

2. A process according to claim 1 wherein the surface on which the protective film is formed is of a metal or alloy comprising one or more of copper, aluminium, titanium, zirconium, tantalum, chromium, cobalt, nickel and iron.

3. A process according to claim 2 wherein the alloy is selected from brasses, cupronickels, mild steel, carbon steels, low alloy steels, stainless steels, high alloy steels, super alloys and zircaloys.

4. A process according to claim 1 wherein the pre-oxidation of the substrate surface is carried out by flaming or heating in an oxidising atmosphere selected from air, carbon dioxide and steam to provide a thin, adherent oxide film.

5. A process according to claim 1 wherein the volatile metal compound having at least one metal-oxygen bond and being capable of thermal decomposition to the metal oxide is selected from metal alkoxides, metal-β-diketonates and metal carboxylates.

6. A process according to claim 5 wherein the volatile metal compound is selected from ethoxides, normal propoxides, isopropoxides, normal butoxides, tertiary butoxides and acetylacetonates.

7. A process according to claim 6 wherein the volatile metal compound is selected from aluminium isopropoxide, titanium isopropoxide, titanium-n-butoxide, zirconium-n-propoxide, chromium acetylacetonate, aluminium acetylacetonate, tantalum ethoxide and niobium ethoxide.

8. A process according to claim 1 wherein the carrier gas stream is selected from nitrogen, helium, argon, carbon dioxide, air and steam.

9. A process according to claim 7 wherein the decomposition is carried out under substantially anhydrous conditions.

10. A process according to claim 1 wherein the volatile metal compound is either dissolved in a compatible solvent or is diluted with a compatible diluent.

11. A process according to claim 10 wherein the solvent or diluent is selected from toluene, methanol, isopropanol and tertiary butanol.

12. A process according to claim 1 wherein the concentration of the volatile metal compound in the carrier gas is less than 10% by volume.

13. A process according to claim 1 wherein the thermal decomposition of the volatile metal compound is carried out at a temperature between 200° and 1200° C.

14. A process according to claim 1 wherein the protective oxide film deposited on the substrate surface is of the same metal as that forming the substrate surface.

* * * * *

UNITED STATES PATENT AND TRADEMARK OFFICE
CERTIFICATE OF CORRECTION

PATENT NO. : 4,297,150
DATED : October 27, 1981
INVENTOR(S) : ALAN I. FOSTER, MALCOLM L. SIMS, and DENNIS YOUNG It is certified that error appears in the above-identified patent and that said Letters Patent are hereby corrected as shown below:

Col. 5, line 65, under the heading in the column "In Gas (% v/v)", change "0.01" to read --0.10--.

Col. 6, line 37, "mold" should read --mild--

Signed and Sealed this

Thirty-first Day of August 1982

[SEAL]

Attest:

GERALD J. MOSSINGHOFF

Attesting Officer     Commissioner of Patents and Trademarks